(12) United States Patent
Mae (10) Patent No.: US 6,979,203 B2
(45) Date of Patent: Dec. 27, 2005

(54) IC SOCKET

(75) Inventor: Katsunori Mae, Takarazuka (JP)

(73) Assignee: Ricoh Company, Ltd., Kanagawa-Ken (JP)

( * ) Notice: Subject to any disclaimer, the term of this patent is extended or adjusted under 35 U.S.C. 154(b) by 0 days.

(21) Appl. No.: 10/277,042

(22) Filed: Oct. 22, 2002

(65) Prior Publication Data

US 2003/0082934 A1 May 1, 2003

(30) Foreign Application Priority Data

Oct. 31, 2001 (JP) .................................... 2001-333938

(51) Int. Cl.[7] .............................................. H01R 9/09
(52) U.S. Cl. ...................................................... 439/73
(58) Field of Search ............................. 439/70, 71, 73, 439/331; 324/754, 755, 758

(56) References Cited

U.S. PATENT DOCUMENTS

| | | | | |
|---|---|---|---|---|
| 5,247,250 A | * | 9/1993 | Rios ........................... | 324/754 |
| 6,083,013 A | * | 7/2000 | Yamagishi ................... | 439/71 |
| 6,142,809 A | * | 11/2000 | Fukunaga ................... | 439/331 |
| 6,152,744 A | * | 11/2000 | Maeda ........................ | 439/71 |
| 6,322,384 B1 | * | 11/2001 | Ikeya ......................... | 439/331 |
| 6,575,767 B2 | * | 6/2003 | Satoh et al. ................. | 439/71 |
| 6,607,396 B1 | * | 8/2003 | Ito ............................. | 439/331 |
| 6,614,247 B2 | * | 9/2003 | Ikeya et al. ................. | 324/755 |

FOREIGN PATENT DOCUMENTS

| | | |
|---|---|---|
| JP | 11-135217 | 5/1999 |
| JP | 11-312566 | 11/1999 |
| JP | 2000-133397 | 5/2000 |
| JP | 2000-260910 | 9/2000 |
| JP | 2001-085128 | 3/2001 |

* cited by examiner

Primary Examiner—Thanh-Tam Le
(74) Attorney, Agent, or Firm—Dickstein Shapiro Morin & Oshinsky LLP

(57) ABSTRACT

An IC socket includes a pressurizing head provided on a counter weight to be movable in at least an approximately vertical direction over a package containing member. The counter weight is pivotally mounted around a shaft, which acts as a fulcrum, situated at the end opposite to a slide member and operated by pivotally rotating around the shaft. A cover fixing member and a ball contacting platform are provided on the lower face of the counter weight close to the end opposite to that provided with the shaft. When the ball contacting platform is situated at the location as designated with solid lines, a ball member on the counter weight is held by an upper portion of the ball contacting platform so as to hold the semiconductor device in the package containing member in a spatially separated position from a tip of pressurizing head. In addition, when the ball contacting platform is displaced by sliding movement to the location as designated with chain double-dashed lines, the vertical location of the ball member and the pressurizing head is gradually lowered. The application of a predetermined magnitude of pressuring force of the semiconductor device, therefore, becomes feasible.

12 Claims, 8 Drawing Sheets

IC SOCKET

BACKGROUND OF THE INVENTION

1. Field

This patent specification relates to the field of IC sockets used primarily for electrical measurements of semiconductor devices and, in particular, to IC sockets suitably used for measurements of devices such as a wafer level chip size package provided with a plurality of minute external contact terminals.

2. Discussion of the Background

IC sockets are widely used for achieving electrical connections between external connecting terminals of semiconductor devices and measurement apparatuses, and for carrying out electrical measurements of characteristics of devices such as CSP (chip size package), for example. An IC socket is provided with a plurality of connecting terminals at the location corresponding to a plurality of external connection terminals of the semiconductor device such that an electrical connection can be achieved between these corresponding terminals.

Regarding the electrical measurements of characteristics of semiconductor devices, there generally exists some resistance at the portions where the IC socket is in contact with the semiconductor device (current-carrying portion), in which the resistance depends largely on contact pressure between the terminals under contact. It is desirable for the IC socket to have a contact resistance that is as small as possible, or infinitesimally close to zero.

In addition, the contact resistance is preferably stable throughout the measurements under current-carrying conditions so that the measurements on current, resistivity, capacitance and etc, and operation check in general, can be carried out satisfactorily without any retardation.

In previously known IC sockets, stable contact between an IC socket with external connection terminals of semiconductor devices is implemented by forming contacts utilizing an elastic body such as a spiral spring or resinous material.

For example, a semiconductor device is placed in an IC socket by using an elastic body such as a spiral spring or resinous material to press against one of the faces of the device opposite to external connection terminals such that the external connection terminals come into contact with the contacting terminals of the IC socket. (For example, Japanese Laid-Open Patent Applications No. 11-135217 and 2000-133397.)

Of particular concern is a wafer level CSP, which has external connection terminals prefabricated therein prior to dicing steps (for example, Japanese Laid-Open Patent Application No. 2000-260910).

The wafer level CSP has in general an outer size of approximately 1 mm square and 0.4 mm thick and is provided with external connection terminals each having a diameter of about 0.2 mm.

As described above, in order to stabilize the contact between the IC socket with external connection terminals of a semiconductor device, one of the faces of the device opposite to external connection terminals is pressed against contacting terminals of the IC socket by means of an elastic body such as a spiral spring or resinous material. Using this method, however, delicate control of pressurizing forces is difficult to achieve.

As a result, when the measurements are made on minute devices such as a wafer level CSP, in particular, difficulties may arise in the previous methods in which adverse effects may take place such as the damage of external connection terminals of the device and cracking and/or fracturing in chips.

SUMMARY OF THE INVENTION

Accordingly, it is an object of the present disclosure to provide an IC socket capable of applying a predetermined magnitude of pressuring force onto a semiconductor device when the semiconductor device is pressed against contacting terminals of the IC socket for implementing measurements of device characteristics.

Another object of the present disclosure is to provide an IC package, including a package guiding member provided with a package containing member for placing a semiconductor device, which is provided on one face thereof with a plurality of external connection terminals, at a predetermined location; a plurality of contacting terminals arranged on the lower face of the package containing member so as to correspond to the plurality of external connection terminals of the semiconductor device placed in the package containing member with the face down; and a pressurizing member for exerting pressurizing force downward onto the semiconductor device placed in the package containing member.

The semiconductor device is thus subjected to a pressurizing force of a predetermined magnitude per unit area through the mass of pressurizing member. As a result, possible adverse effects such as the damage of external connection terminals of the device and cracking and/or fracturing in chips, can be obviated during measurements of device characteristics even for minute devices such as a wafer level CSP.

The following brief description is a synopsis of only selected features and attributes of the present disclosure. A more complete description thereof is found below in the section entitled "Description of the Preferred Embodiments."

An IC socket disclosed herein preferably includes at least a pressurizing member supporting system for holding a pressurizing member over, and not in contact with, a semiconductor device placed in a package containing member, and for subsequently gradually lowering the pressurizing member to bring it into contact with the semiconductor device. With this structure of the IC socket, a rapid application of pressurizing force onto the semiconductor device can be prevented, thereby obviating adverse effects such as the damage of external connection terminals of the device and cracking and/or fracturing in chips.

As an example, the pressurizing member supporting system preferably includes a supporting member for supporting a pressurizing member that is movable at least in an approximately vertical direction above the package containing member and a slide member for holding the supporting member with an upper portion of the slide member above the package containing member when the semiconductor device is not in contact with the pressurizing member and for gradually lowering the pressurizing member by holding the supporting member with a slope portion descending from the upper portion to a lower portion when the semiconductor device is brought into contact with the pressurizing member.

In addition, in order to avoid any deviation of the location for applying pressurizing force onto the semiconductor device, it is preferable that the pressurizing member supporting system is pivotally mounted around a shaft, which acts as a fulcrum, situated at the end opposite to the slide member and operated by pivotally rotating around the shaft.

When the slide member is situated for holding the supporting member with an upper portion of the slide member above the package containing member, the upper portion of the slide member is in contact with pressurizing member supporting system, while the semiconductor device is not in contact with the pressurizing member.

Thereafter, by displacing the slide member by a sliding movement toward a slope portion of the slide member, the pressurizing member is lowered gradually along the inclination of the slope portion, the pressurizing head is brought to contact with the semiconductor device, and the device is subjected to a gradually increasing downward pressure.

As a result, a rapid application of pressurizing force onto the semiconductor device can be prevented, to thereby be able to obviate adverse effects such as the damage of external contact terminals of the device and cracking and/or fracturing in chips.

The pressurizing member is also preferably provided with a rotating member placed at the location corresponding to the slide member so as to decrease the friction caused between the pressurizing member and the slide member. By means of the rotating member, the pressurizing member can be lowered smoothly along the inclination of the slope portion and the abrasion of the slide member can be reduced by the decrease in the friction between the pressurizing member and slide member.

The pressurizing member supporting system is also preferably provided under a cover member which covers the package containing member.

With the present construction of the cover member and pressurizing member supporting system, the steps for placing the semiconductor device in the package containing member can be carried out without unnecessary steps of handling pressurizing member supporting system and pressurizing head. As a result, working efficiency can be increased for the steps of placing the semiconductor device in the package containing member.

A cover fixing member can also be formed integrally with the slide member so that the cover member can slide and may be fixed when it covers the package containing member unfixed when the pressurizing member is in contact with the upper portion of the slide member and fixed again when the semiconductor device placed in the package containing member is in contact with the pressurizing member.

The application of unnecessary external force can thus be prevented when the semiconductor device is pressurized, thereby obviating adverse effects such as the damage of external connection terminals of the device and pressurizing member.

Furthermore, each of the contacting terminal supporting members that support a plurality of contacting terminals and provide a location adjusting system for fixing the contacting terminal supporting member through minute adjustments is preferably provided individually separated from the package guiding member.

Demands for an operating accuracy greater than that of the original design of IC sockets are ever increasing with the change in the size of package, shape and size of external connection terminals and the miniaturization of terminal pitch, as evidenced by wafer level CPSs. By means of the present contacting terminal supporting member and the location adjusting system, it becomes feasible to carry out fine, precise, minute adjustments and to absorb cumulative error margins from components of the IC sockets. The foregoing features and other advantages of the invention will be more readily apparent from the following detailed description and appended claims, which are provided with the accompanying drawings.

BRIEF DESCRIPTION OF THE DRAWINGS

FIGS. 1A through 1D are drawings illustrating an IC socket according to one embodiment disclosed herein, in which

DESCRIPTION OF THE PREFERRED EMBODIMENTS

In the detailed description which follows, specific embodiments of components, system and method are described, which are particularly useful for electrical measurements of relatively small semiconductor devices. It is understood, however, that the present disclosure is not limited to these embodiments. For example, the components, system and method for the measurements disclosed herein may also be adaptable to any form of devices under electrical measurements. Other embodiments will be apparent to those skilled in the art upon reading the following description.

Figure 1A:
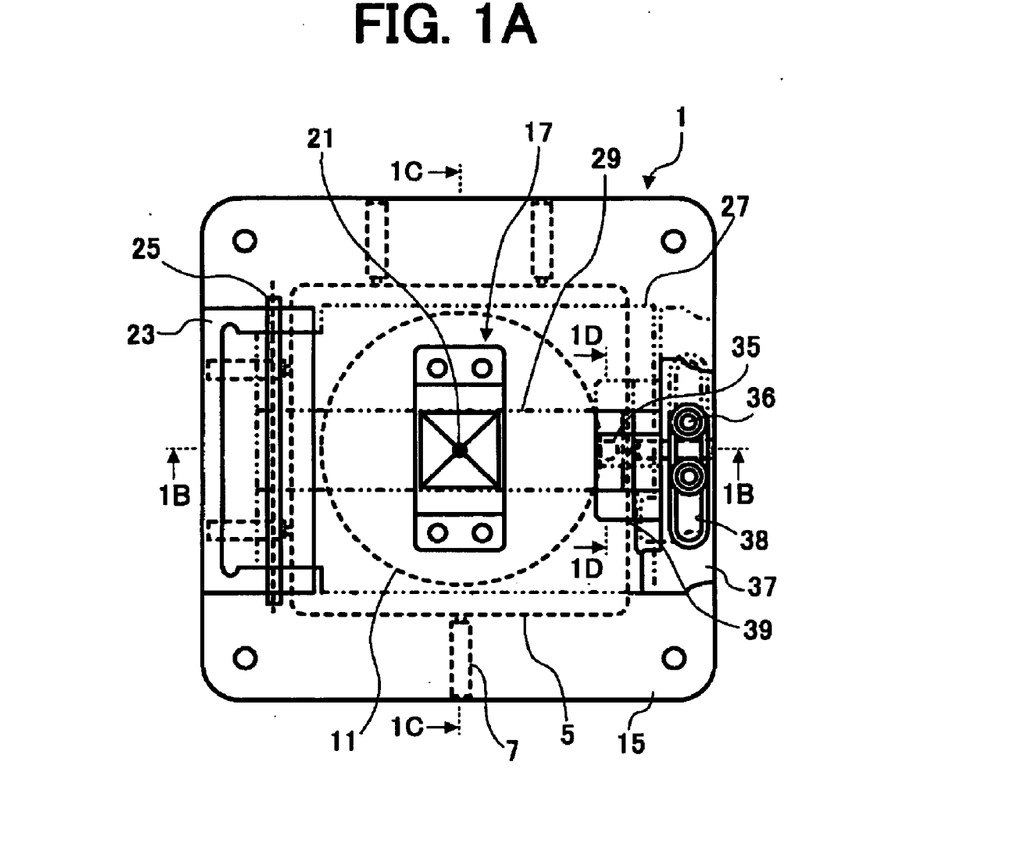
FIG. 1A is a top view of the IC socket.
Figure 1B:
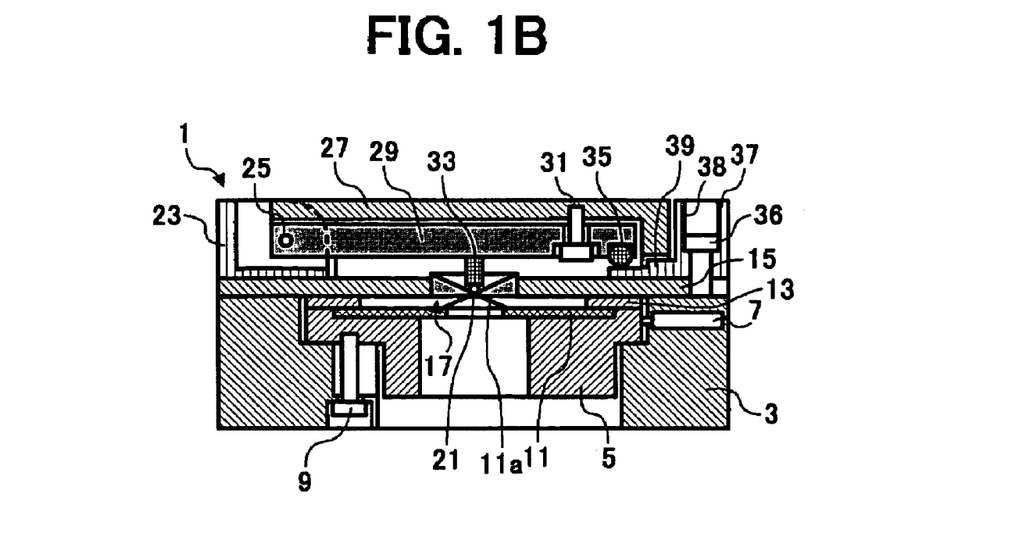
FIGS. 1B and 1C are cross-sectional views taken along the lines, 1B—1B and 1C—1C, respectively.
Figure 1C:
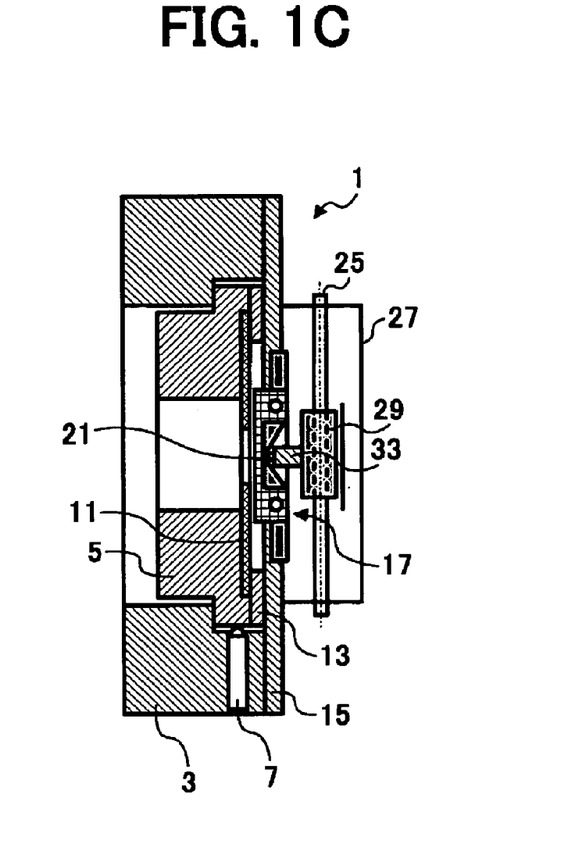
Figure 1D:
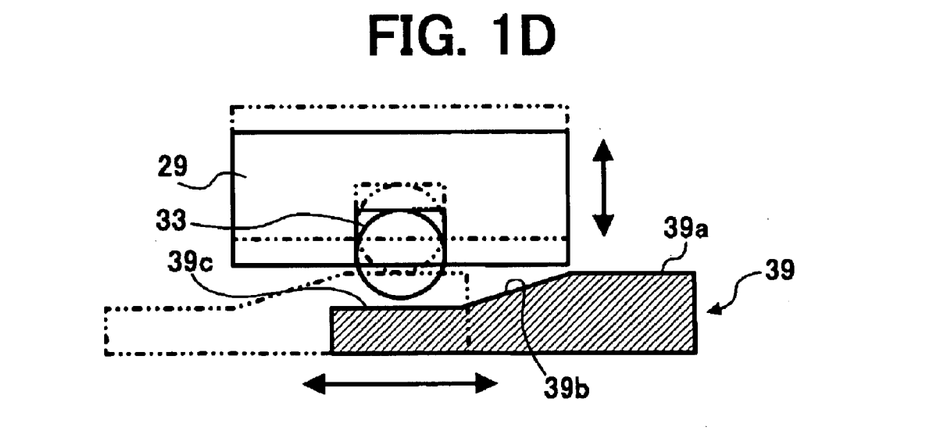
FIG. 1D is an enlarged cross-sectional view for the portion along the line 1D—1D.

FIGS. 1A through 1D are drawings illustrating an IC socket according to one embodiment disclosed herein, in which FIG. 1A is a top view of IC socket, and FIGS. 1B and 1C are cross-sectional views taken along the lines, 1B—1B and 1C—1C, respectively. In addition, FIG. 1D is an enlarged cross-sectional view for the portion along the line 1D—1D.

The IC socket 1 disclosed herein comprises a base member 3 of an approximately rectangular parallelepiped. There is provided in the base member 3 a spatial portion which passes through from the top to bottom. A contact unit supporting member 5 is provided in the spatial portion, in turn, having an appropriate distance with respect to the base member 1 such that the location of the supporting member 5 is adjustable along the horizontal direction relative to the spatial portion.

A plurality of location adjusting screws 7 is further provided on the inner sides of the base member 3 designed for use in three point contact adjustment such that minute adjustments of the location and inclination of the supporting member 5 can be made along the horizontal direction.

In addition, a fixing screw 9 is provided on the bottom face of the base member 3 for fixing the contact unit supporting member 5. The contact unit supporting member 5 is therefore fixed to the base member 3 by means of the six location adjusting screws 7 and the fixing screw 9.

On the upper face of the contact unit supporting member 5, there provided is a contact unit 11, the outer periphery of which is surrounded by a cover 13 in use for fixing the contact unit 11 onto the contact unit supporting member 5.

In addition, a cover chassis 15 is further provided on the base member 3 designed to cover the contact unit supporting member 5, contact unit 11, and cover 13. An opening is provided at the center of the cover chassis 15, in which a package guiding member 17 is further provided.

Figure 2:
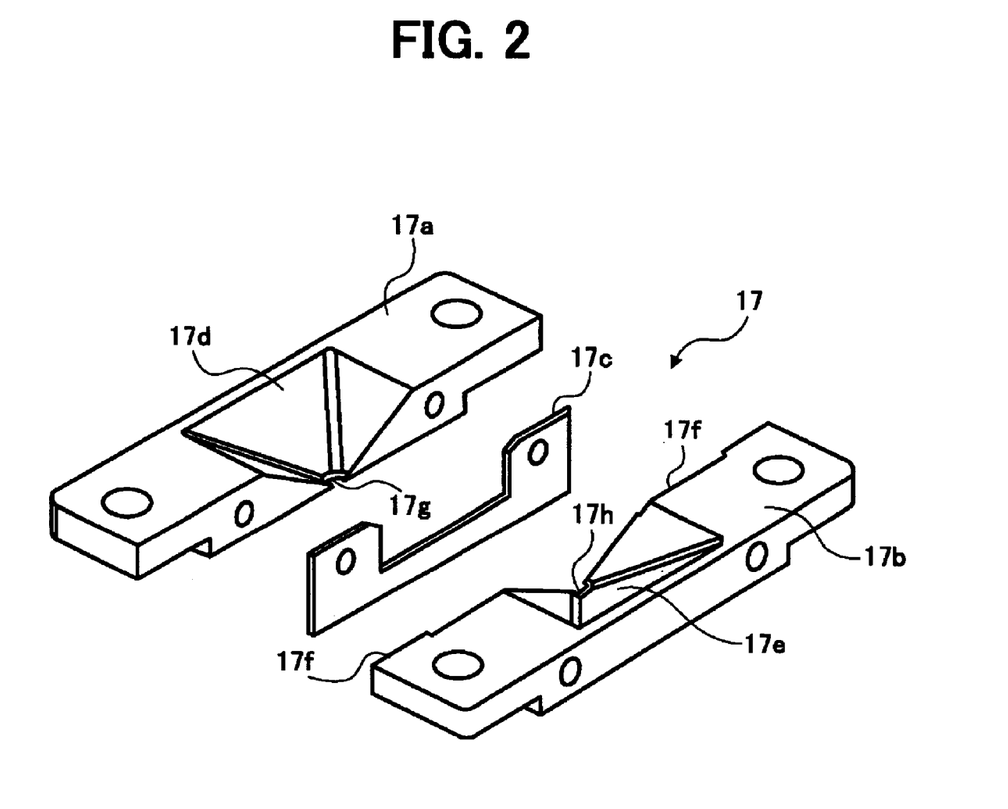
FIG. 2 is a perspective view of the components for forming a package guiding member according to one embodiment disclosed herein.

FIG. 2 is a perspective view of the components disclosed herein for forming package guiding member 17.

The package guiding member 17 is composed of three members, 17a, 17b and 17c. The member 17a is provided with a concave portion 17d having an inclined plane descending toward the center of package guiding member 17 which faces the opposing face of the member 17b. Similarly, the member 17b is provided with a concave portion 17e having an inclined plane descending toward the center of package guiding member 17 which faces the opposing face of the above mentioned member 17a.

The members 17a and 17b are formed of polyamide resinous materials, for example, and tightened with screws (not shown) with the sheet member 17c interposed between them.

The member 17c is formed of stainless steel, for example.

In addition, a pair of steps 17f are formed to properly locate the member 17c on the top portion of the face of the member 17b opposing to the member 17a.

There are formed notches 17g and 17h at the bottom of the concave portions 17d and 17e, respectively, such that the size of the opening, which is resulted from adjoining notches 17g and 17h are slightly larger than the outer size of the wafer level CSP to be measured presently.

The sheet member 17c is then affixed to the members 17a and 17b such that the portion of the member 17c situated below the above mentioned opening resulting from adjoining notches 17g and 17h is utilized for supporting the lower face of the CSP under measurements.

Therefore, the sheet member 17c and notches 17g and 17h altogether constitute a package containing member.

Figure 3:
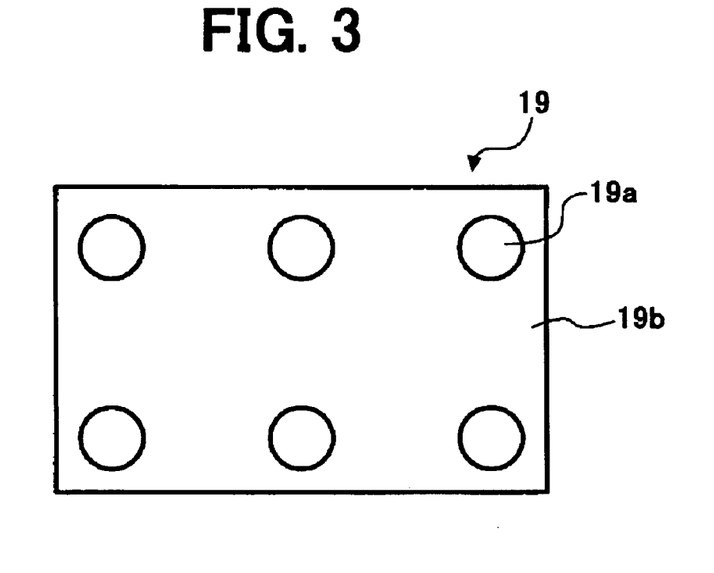
FIG. 3 is a drawing illustrating the bottom face of a wafer level CSP to be measured.

FIG. 3 is a drawing illustrating the bottom face of wafer level CSP 19 under measurements.

Referring to FIG. 3, the wafer level CSP is formed in general as a CSP with prefabricated external connection terminals 19a.

The wafer level CSP 19 has an outer size with a base of approximately 0.83 mm by 1.32 mm and a thickness of 0.40 mm, for example. On the bottom face 19b of the wafer level CSP 19, six external contact terminals 19a are formed lengthwise and breadthwise, having a distance of approximately 0.50 mm between them. Each of the external contact terminals 19b has a diameter of approximately 0.18 mm and a height of 0.08 mm, for example.

Figure 4:
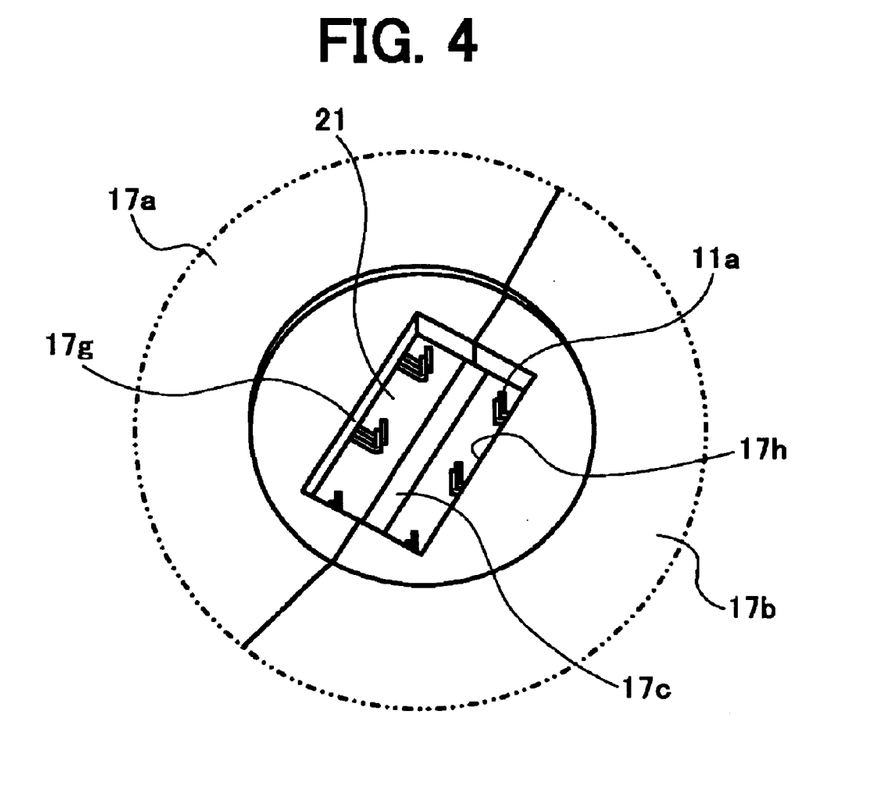
FIG. 4 is an enlarged perspective view illustrating the package containing member according to one embodiment disclosed herein.

FIG. 4 is an enlarged perspective view of the package containing member.

Referring to FIG. 4, the package containing member operates to properly adjust the location of the wafer level CSP 19 along the horizontal direction by means of the opening resulted from adjoining notches, 17g and 17h, as well as with respect to horizontal direction perpendicular to the horizontal direction by means of the sheet member 17c.

A plurality of contacting terminals 11a are provided on the lower face of the package containing member 21 with the location of the contacting terminals 11a corresponding to that of external connection terminals 19a of wafer level CSP 19. Each of the contacting terminals 11a has a needle-shaped form having a diameter of 0.025 mm, for example.

Figure 5:
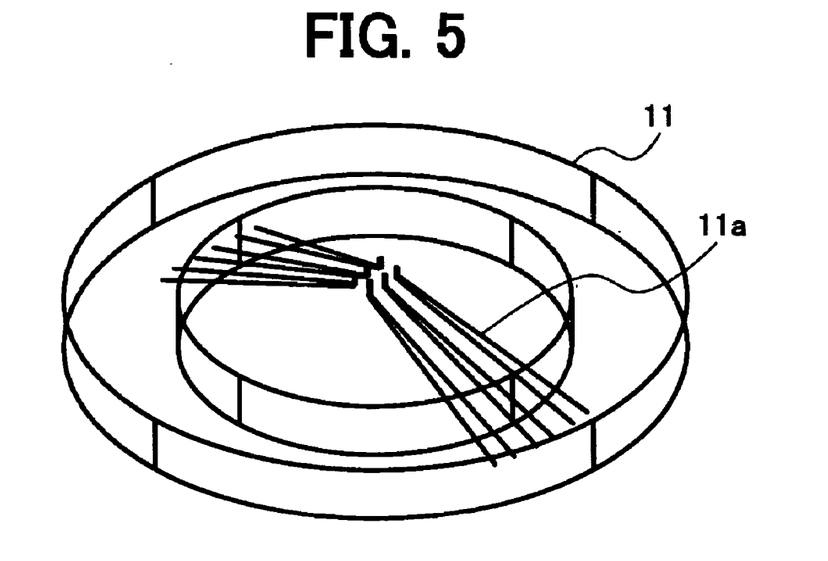
FIG. 5 is a perspective view broadly illustrating a contact unit according to one embodiment disclosed herein.

FIG. 5 is a perspective view broadly illustrating the contact unit 11.

Referring to FIG. 5, two contacting terminals 11a of the contact unit 11 are provided to each of the external contact terminal 19a so as to decrease contact resistance between the contacting terminal 11a and external contact terminal 19a.

The contact unit 11 is formed of base materials such as glass or glass-filled epoxy, for example, which is further provided with a substrate (not shown) having a pattern of printed signal wiring formed thereon.

Figure 6:
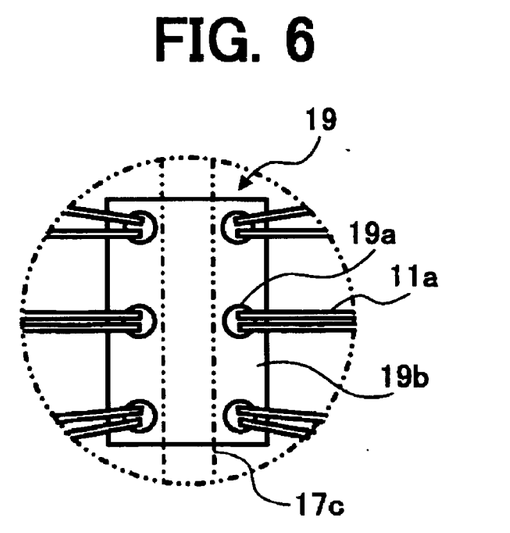
FIG. 6 is a perspective view of the bottom portion of the wafer level CSP provided with contacting terminals in contact with external connection terminals.

FIG. 6 is a perspective view looking at the bottom portion of the wafer level CSP 19 upward from thereunder illustrating contacting terminals 11a in contact with external connection terminals 19a.

It is noted that the contacting terminals 11a are designed to be brought into contact with external connection terminals 19a in pairs to form so-called Kelvin contact, which is effective in reducing contact resistance through the contacting terminals 11a.

It is also noted that when the wafer level CSP 19 is placed in the package containing member 21, the sheet member 17c used for determining the proper vertical location is situated at the bottom of the CSP 19 so as not to electrically contact the external contact terminals 19a.

Since the sheet member 17c is formed of electrically conductive stainless steel, the member 17c is situated at the bottom of the CSP 19 to properly hold the CSP 19 by contacting its non-conductive portion at the bottom thereof, but is not electrically contacting the external connection terminal 19a as would the contacting terminals 11a described above. A short circuit can therefore be avoided between external contact terminals 19a.

The formation of the sheet member 17c, however, is not limited to the above example. The sheet member 17c may also be formed of electrically non-conductive materials, for example. In such a case, the member 17c may support the CSP 19 at either the non-conductive portion thereof or the electrically conductive portion such as external connection terminal 19a.

Referring again to FIG. 1, a shaft supporting member 23 is fixed onto the cover chassis 15 of the IC socket 1. A shaft 25 is supported horizontally by the supporting member 23. In addition, a cover (lid member) 27 and a weight (or counter weight) 29 are further pivotally mounted around the shaft 25, which acts as a fulcrum.

Figure 7:
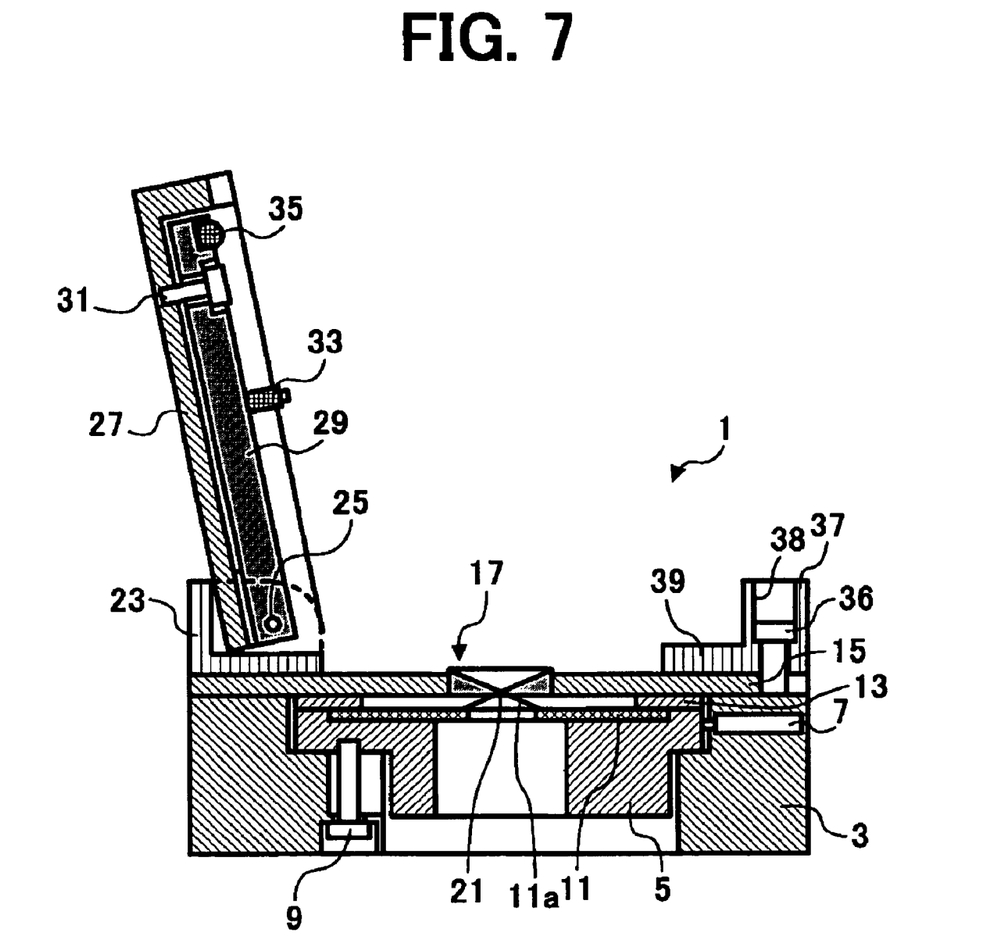
FIG. 7 is a cross-sectional view with the cover and counter weight being opened according to one embodiment disclosed herein.

FIGS. 1 and 7 are cross-sectional views with the cover 27 and weight 29 being closed and opened, respectively. Although the cover 27 and weight 29 are pivotally mounted around the fulcrum shaft 25 common to both elements, they are not integrally formed. As a result, they can be pivotally operated independent of each other by rotating around the shaft 25.

The weight 29 is situated on the inner side of the cover 27. In the case where the cover 27 is closed, the amount of separation of the weight 29 from the cover 27 (or the distance of lowering the former with respect to the latter) is herein limited and is adjusted by an adjusting screw 31 used for determining the distance of lowering the weight 29.

A pressurizing head 33 provided on the face of the weight 29 at the proper location to correspond to package containing member 21 is used for pressing (or exerting pressurizing force on) the wafer level CSP 19 placed in the member 21 downward onto the face of the CSP 19 opposite to that provided with external connection terminals 19a.

At the tip of the pressurizing head 33, a ball member formed of plastic materials is provided to make contact with the wafer level CSP 19. In addition, an elastic body such as a spiral spring is contained in the pressurizing head 33. The spiral spring operates the wafer level CSP 19 by applying a pressurizing force of a predetermined magnitude or larger, as well as preventing breakdown caused by the application of excessive force.

A ball (rotating) member 35 is provided on the lower face of weight 29 close to the end opposite to the shaft 25.

On the cover chassis 15, a cover (lid) fixing member 37 is provided on the side opposite to the shaft supporting member 23. The package containing member 21 is now situated between this fixing member 37 and shaft 25.

An elongated hole 38 is formed in the cover fixing member 37 with its longer axis aligned parallel to the shaft 25. In addition, a guide pin 36 fixed to cover chassis 15 is provided in the elongated hole 38 such that the location of the cover fixing member 37 can slidably be adjusted in the horizontal plane and parallel to the shaft 25 by being displaced along the longer axis as a guide.

Figure 8A:
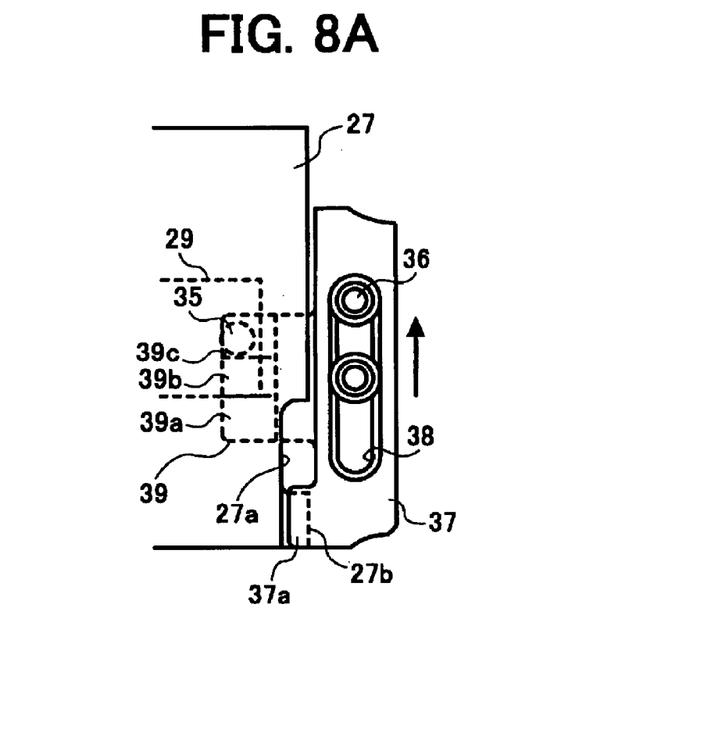
FIGS. 8A and 8B are enlarged top views of the portions in the vicinity of the cover fixing member with the cover being fixed and unfixed, respectively, according to one embodiment disclosed herein.
Figure 8B:
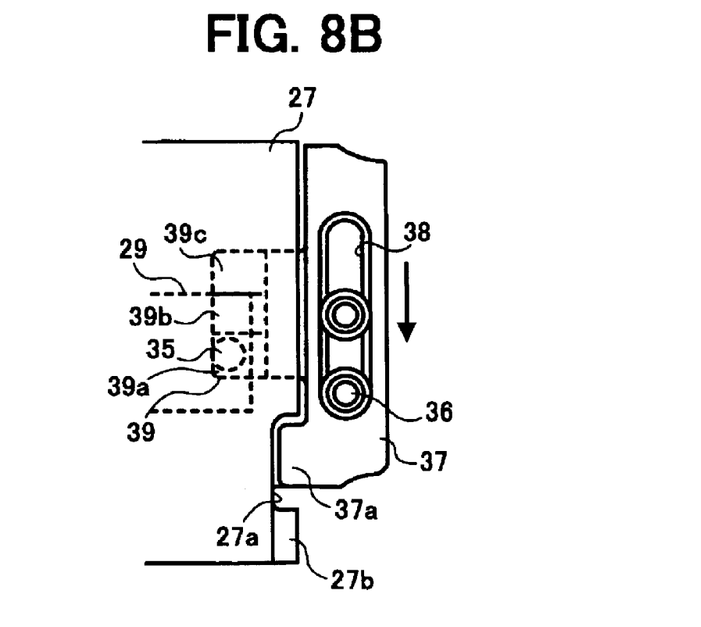

FIGS. 8A and 8B are enlarged top views of the portions in the vicinity of cover fixing member 37, with the cover 27 being fixed and unfixed, respectively. The location with fixed cover 27 therefore corresponds to that shown with solid lines in FIG. 1A, while the location with unfixed cover 27 corresponds to that shown with chain double-dashed lines in FIG. 1B.

A protruding portion 37a is formed close to one end of the cover fixing member 37. Corresponding to the protruding portion 37a, a concave portion 27a and a neighboring step portion 27b are formed in the vicinity of the end portion of cover fixing member 27.

Prior to closing the cover 27, the cover fixing member 37 is displaced as shown FIG. 8B such that the protruding portion 37a of cover fixing member 37 is situated to correspond to the concave portion 27a of the cover 27 (i.e., 'cover opened position').

After closing the cover 27, the location of cover fixing member 37 is adjusted by a sliding-movement as shown FIG. 8A such that the protruding portion 37a of cover fixing member 37 is situated on the top of the step portion 27b of the cover 27 ('cover fixed position'). The cover 27 is thus fixed with the cover fixing member 37.

In the case where the cover fixing member 37 is at the cover fixed position (FIG. 8A) with the cover 27 being opened previously, the above noted construction is designed such that the cover 27 cannot be closed right away, since the step portion 27b of cover 27 has to come in contact before closing with the protruding portion 37a of cover fixing member 37.

As a result, unnecessary closing in this case, and undue application of excessive pressurizing force can be prevented onto wafer level CSP 19 placed in the package containing member 21 can be prevented.

The cover fixing member 37 is additionally provided with a ball contacting platform (slide member) 39 so as to be situated at the location corresponding to the ball member 35 which is provided on the lower face of weight 29.

The ball contacting platform 39 consists of several portions such as an upper portion 39a, slope portion 39b descending from the upper portion 39a and lower portion 39c situated lower than the upper portion 39a.

In the case where the cover fixing member 37 is at the cover opened position and the cover 27 is not fixed as shown with chain double-dashed lines in FIG. 1D and in FIG. 8B, the upper portion 39a of the ball contacting platform 39 is situated at the location corresponding to the ball member 35 on the weight 29. As a result, the ball member 35 is brought in contact with the upper portion 39a.

Figure 9:
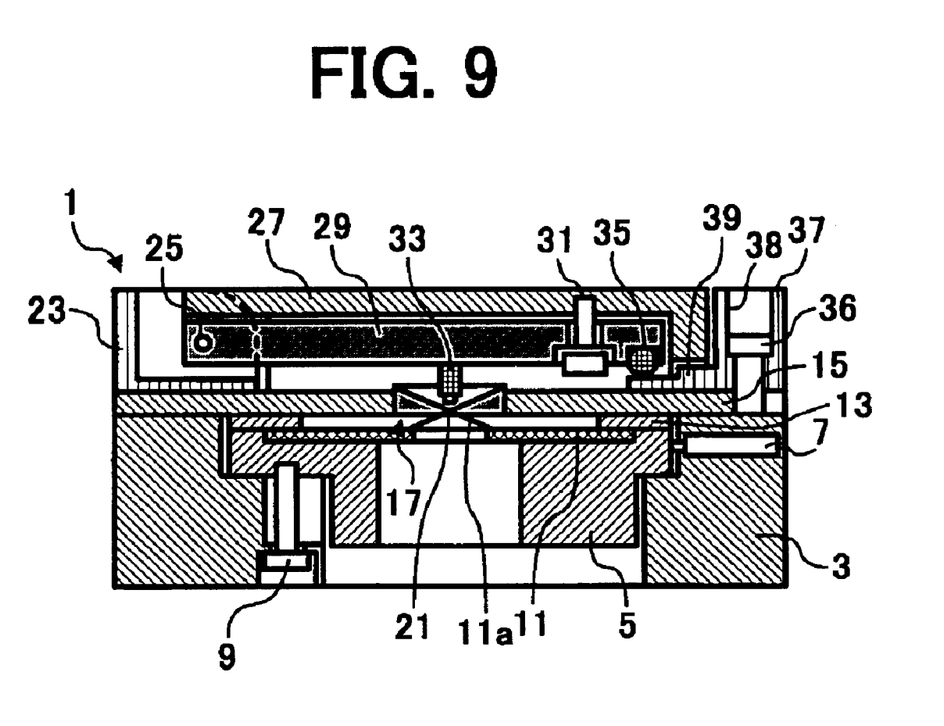
FIG. 9 is a cross-sectional view taken along the line, 1B—1B, of FIG. 1A, in case where the cover is closed but not yet fixed by the cover fixing member according to one embodiment disclosed herein.

FIG. 9 is a cross-sectional view taken along the line, 1B—1B, of FIG. 1A, in which the cover 27 is closed but not yet fixed by the cover fixing member 37.

In such a case, since the ball member 35 on the weight 29 is in contact with the upper portion 39a of the ball contacting platform 39 as described above (also shown with chain double-dashed lines in FIG. 1D), the weight 29 is now supported by the upper portion 39a and shaft 25. It is noted herein that the tip of the pressurizing head 33 is not in contact with the wafer level CSP 19 placed in the package containing member 21.

When the cover fixing member 37 is displaced by sliding movement from the cover opened position shown in FIG. 8B to the cover fixed position shown in FIG. 8A, the ball member 35 of the weight 29 rolls with the movement to displace the location of its contact from the upper portion 39a through the lower portion 39c of the ball contacting platform 39 and the vertical location of the ball member 35 is gradually lowered.

According to such a change in the vertical location, the weight 29 and pressurizing head 33 descend gradually, the pressurizing head 33 is brought into contact with the wafer level CSP 19 placed in the package containing member 21 and the wafer level CSP 19 is subjected to a gradually increasing downward pressure.

Since the mass of the weight 29 is suitably selected so as to generate an appropriate magnitude of the pressuring force, adverse effects such as the damage of external connection terminals 19a of the wafer level CSP, and cracking and/or fracturing in chips can be prevented with the above noted gradual increase in the applied pressure.

In the case where the cover fixing member 37 is at the cover fixed position with the cover 27 being closed, the weight 29 is now supported by shaft 25 and adjusting screw 31 is used for determining the distance for lowering weight 29 between pressurizing head 33 and wafer level CSP 19. The wafer level CSP 19 is then applied with appropriate magnitude of the pressuring force by way of the pressurizing head 33.

As a result, excellent electrical contact is achieved between external connection terminals 19a of the wafer level CSP and contacting terminals 11a of the contact unit 11.

Regarding removing the wafer level CSP 19 from the package containing member 21 after completing electrical measurements, the cover fixing member 37 is displaced by a sliding movement from the cover fixed position shown in FIG. 8A to the cover opened position shown in FIG. 8B.

The ball member 35 of the weight 29 now rolls with the movement to gradually displace the location of its contact through slope portion 39b to the upper portion 39a, thereby elevating the pressurizing head 33 as the weight 29 is raised.

As a result, the wafer level CSP 19 is released from the downward pressure. Thereafter, the cover 27 is opened and the wafer level CSP 19 is taken out of the package containing member 21.

While the present example has been described with reference primarily to wafer level CSP as one of the devices to be measured as shown in FIG. 3, it is not intended to limit the disclosure. For example, the measurements may also be carried out on various semiconductor devices by altering the size of package containing member and/or the arrangement of contacting terminals.

While the Kelvin contact is also adopted in the present example in which a pair of contacting terminals is brought into contact with each external connection terminal of the wafer level CSP, it is not intended to limit the disclosure either. For example, other means using one contacting terminal or three or more contacting terminals may also be adopted for the measurements.

Furthermore, while the pressurizing head 33 is formed containing an elastic body therein in the present example, other materials may alternatively be adopted such as a single bar element and other similar materials, for example, as long as the material is capable of pressurizing a semiconductor device placed in the package containing member through the weight of counter weight.

It is apparent from the above description that the IC socket disclosed herein can offer several advantages for the measurements of semiconductor device characteristics.

For example, the IC socket is provided with an IC socket including a package guiding member provided with a package containing member for placing a semiconductor device provided in plane with a plurality of external connection terminals, at a predetermined location; a plurality of contacting terminals arranged on the lower face of the package containing member so as to correspond to the plurality of external connection terminals of the semiconductor device placed in the package containing member with the face down; and a pressurizing member for exerting pressurizing force downward onto the semiconductor device placed in the package containing member.

As a result, the IC socket can apply a pressurizing force of a predetermined magnitude per unit area and possible adverse effects such as the damage of external connection terminals of the device and cracking and/or fracturing in chips can be obviated during measurements of device characteristics even for minute devices such as a wafer level CSP.

In addition, the slide member in the IC package is situated once for holding the supporting member above the package containing member while the semiconductor device is not in contact with the pressurizing member, and then gradually lowered to bring into contact with the semiconductor device.

As a result, a rapid application of pressurizing force onto the semiconductor device can be prevented and adverse effects can be obviated such as the damage of external connection terminals of the device and cracking and/or fracturing in chips.

Still in addition, the pressurizing member supporting system in the IC socket is provided with a supporting member for supporting the pressurizing member, movable at least in an approximately vertical direction above the package containing member, and a slide member for holding the supporting member with an upper portion of the slide member above the package containing member when the semiconductor device is not in contact with the pressurizing member and for gradually lowering the pressurizing member by holding the supporting member with the slope portion descending from the upper portion to the lower portion when the semiconductor device is brought into contact with the pressurizing member.

A rapid application of pressurizing force onto the semiconductor device can thereby be prevented, and adverse effects such as the damage of external connection terminals of the device and cracking and/or fracturing in chips can be obviated.

The pressurizing member in the IC socket is provided with a rotating member placed at the location corresponding to the slide member so as to decrease the friction caused between pressurizing member and slide member. By means of the rotating member, the pressurizing member can be lowered smoothly along the inclination of the slope portion and the abrasion of slide member can therefore be reduced by the decrease in the friction between pressurizing member and slide member.

Furthermore, the pressurizing member supporting system is provided under a cover member provided for covering the package containing member in the IC socket disclosed herein.

With the present construction of the cover member and pressurizing member supporting system, the steps for placing the semiconductor device in the package containing member can be carried out without unnecessary steps of handling pressurizing member supporting system and pressurizing head. As a result, working efficiency can be increased for the steps of placing the semiconductor device in the package containing member.

The cover fixing member is additionally formed integrally with the slide member for fixing the cover member when it covers the package containing member, and slidably provided so as to unfix the cover member when the pressurizing member is in contact with the upper portion of the slide member and to fix the cover member when the semiconductor device placed in the package containing member is in contact with the pressurizing member.

The application of unnecessary external force can thus be prevented when pressurizing the semiconductor device, thereby obviating adverse effects such as the damage of external connection of the device and pressurizing member.

Furthermore, each of the contacting terminal supporting member for supporting a plurality of contacting terminals and the location adjusting system for fixing the contacting terminal supporting member through minute adjustments, are preferably provided individually separated from the package guiding member.

By means of the present contacting terminal supporting member and the location adjusting system, it becomes feasible to carry out fine, precise adjustments and to absorb cumulative error margins from components of the IC sockets.

The process steps set forth in the present description on the formation of IC sockets and the electrical measurements of semiconductor devices utilizing such sockets may be implemented using conventional general purpose microprocessors, programmed according to the teachings in the present specification, as will be appreciated to those skilled in the relevant arts. Appropriate software coding can readily be prepared by skilled programmers based on the teachings of the present disclosure, as will also be apparent to those skilled in the relevant arts.

The present specification thus also includes a computer-based product which may be hosted on a storage medium and includes instructions which can be used to program a microprocessor to perform a process in accordance with the present disclosure. This storage medium can include, but is not limited to, any type of disc including floppy discs, optical discs, CD-ROMs, magneto-optical discs, ROMs, RAMs, EPROMs, EEPROMs, flash memory, magnetic or optical cards or any type of media suitable for storing electronic instructions.

Additional modifications and variations of the present invention are possible in light of the above teachings. It is therefore to be understood that within the scope of the appended claims, the invention may be practiced other than as specifically described herein.

This document claims priority and contains subject matter related to Japanese Patent Application No. 2001-333938, filed with the Japanese Patent Office on Oct. 31, 2001, the entire contents of which are hereby incorporated by reference.

What is claimed as new and desired to be secured by Letters Patent of the United States is:

1. An IC socket, comprising:
   a package guiding member provided with a package containing member for placing a semiconductor device at a predetermined location, said semiconductor device being provided on one face thereof with a plurality of external connection terminals;
   a plurality of contacting terminals arranged on a lower face of said package containing member so as to correspond to said plurality of external connection terminals of said semiconductor device placed in said package containing member with said face down;
   a pressurizing member comprising a weight and a shaft with a ball/rotating member for exerting pressurizing force downward onto said semiconductor device placed in said package containing member through a mass of said pressurizing member, said pressurizing member being movable with respect to said package guiding member such that said IC socket has an open position and a closed position; and
   a pressurizing member supporting system for holding said pressurizing member over, and not in contact with, said semiconductor device when said IC socket is in said closed position and subsequently gradually lowering said pressurizing member to bring said pressurizing member into contact with said semiconductor device.

2. The IC socket according to claim 1, wherein said pressurizing member supporting system comprises a supporting member for supporting said pressurizing member to be movable at least in approximately vertical direction above said package containing member, and a slide member for holding said supporting member with an upper portion of said slide member above said package containing member when said semiconductor device is not in contact with said pressurizing member and for gradually lowering said pressurizing member by holding said supporting member with a slope portion descending from said upper portion to a lower portion when said semiconductor device is brought into contact with said pressurizing member.

3. The IC socket according to claim 2, wherein said pressurizing member is provided with a rotating member placed at a location corresponding to said slide member so as to decrease a friction caused between said pressurizing member and said slide member.

4. The IC socket according to claim 2, wherein said pressurizing member supporting system is provided under a cover member which is provided for covering said package containing member.

5. The IC socket according to claim 4, further comprising a cover fixing member formed integrally with said slide member, for fixing said cover member when said cover member covers said package containing member, and slidably provided so as to unfix said cover member when said pressurizing member is in contact with said upper portion of said slide member and to fix said cover member when said semiconductor device placed in said package containing member is in contact with said pressurizing member.

6. The IC socket according to claim 1, further comprising a contacting terminal supporting member for supporting said plurality of contacting terminals, and a location adjusting system for fixing said contacting terminal supporting member through minute adjustments, wherein said contacting terminal supporting member and said location adjusting system are each provided individually separated from said package guiding member.

7. An IC socket, comprising:
   a package guiding means provided with a package containing means for placing a semiconductor device at a predetermined location, said semiconductor device being provided on one face thereof with a plurality of external connection terminal means;
   a plurality of contacting terminal means arranged on a lower face of said package containing means so as to correspond to said plurality of external connection terminal means of said semiconductor device placed in said package containing means with said face down;
   a pressurizing means comprising a weight and a shaft with a ball/rotating member for exerting pressurizing force downward onto said semiconductor device placed in said package containing means through a mass of said pressurizing means, said pressurizing means being movable with respect to said package guiding means such that said IC socket has an open position and a closed position; and
   a pressurizing member supporting means for holding said pressurizing means over, and not in contact with, said semiconductor device when said IC socket is in said closed position and subsequently gradually lowering said pressurizing member to bring said pressurizing member into contact with said semiconductor device.

8. The IC socket according to claim 7, wherein said pressurizing member supporting means comprises a supporting means for supporting said pressurizing means to be movable at least in approximately vertical direction above said package containing means, and slide means for holding said supporting means with an upper portion of said slide means above said package containing means when said semiconductor device is not in contact with said pressurizing means, and for gradually lowering said pressurizing means by holding said supporting means with a slope portion descending from said upper portion to a lower portion when said semiconductor device is brought into contact with said pressurizing means.

9. The IC socket according to claim 8, wherein said pressurizing means is provided with a rotating means placed at a location corresponding to said slide means so as to decrease a friction caused between said pressurizing means and said slide means.

10. The IC socket according to claim 8, wherein said pressurizing member supporting means is provided under a cover means which is provided for covering said package containing means.

11. The IC socket according to claim 10, further comprising a cover fixing means formed integrally with said slide means for fixing said cover means when said cover means covers said package containing means, and slidably provided so as to unfix said cover means when said pressurizing means is in contact with said upper portion of said slide means and to fix said cover means when said semiconductor device placed in said package containing means is in contact with said pressurizing means.

12. The IC socket according to claim 7, further comprising a contacting terminal supporting means for supporting said plurality of contacting terminal means, and a location adjusting means for fixing said contacting terminal supporting means through minute adjustments, wherein said contacting terminal supporting means and said location adjusting means are each provided individually separated from said package guiding means.

* * * * *